United States Patent
Kim et al.

(10) Patent No.: US 10,037,811 B1
(45) Date of Patent: Jul. 31, 2018

(54) INTEGRATED CIRCUITS COMPENSATING FOR TIMING SKEW DIFFERENCE BETWEEN SIGNALS

(71) Applicant: SK hynix Inc., Icheon-si, Gyeonggi-do (KR)

(72) Inventors: Chang Hyun Kim, Seoul (KR); Kibong Koo, Yongin-si (KR); Choung Ki Song, Yongin-si (KR); Byung Kuk Yoon, Suwon-si (KR); Yo Sep Lee, Icheon-si (KR); Jae Seung Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/652,962

(22) Filed: Jul. 18, 2017

(30) Foreign Application Priority Data

Jan. 31, 2017 (KR) .......................... 10-2017-0014105

(51) Int. Cl.
  *G11C 7/00* (2006.01)
  *G11C 16/32* (2006.01)
  *G11C 16/08* (2006.01)

(52) U.S. Cl.
  CPC .............. *G11C 16/32* (2013.01); *G11C 16/08* (2013.01)

(58) Field of Classification Search
  CPC .................................. G11C 6/32; G11C 16/08
  USPC ............................................. 365/193, 185.11
  See application file for complete search history.

(56) References Cited

U.S. PATENT DOCUMENTS 9,673,798 B1 * 6/2017 Tang .................... H03K 5/1565

FOREIGN PATENT DOCUMENTS

KR    20130011355 A    1/2013

* cited by examiner

*Primary Examiner* — Huan Hoang
(74) *Attorney, Agent, or Firm* — William Park & Associates Ltd.

(57) ABSTRACT

An integrated circuit including semiconductor devices may be provided. The semiconductor device may be configured to compare phases of strobe signals which are generated according to internal delay times of the semiconductor devices and configured to control points of time that an internal command is inputted to the internal circuits of the semiconductor devices according to a comparison result of the phases of the strobe signals.

33 Claims, 9 Drawing Sheets

INTEGRATED CIRCUITS COMPENSATING FOR TIMING SKEW DIFFERENCE BETWEEN SIGNALS

CROSS-REFERENCE TO RELATED APPLICATIONS

The present application claims priority under 35 U.S.C 119(a) to Korean Application No. 10-2017-0014105, filed on Jan. 31, 2017, which is incorporated herein by reference in its entirety.

BACKGROUND

1. Technical Field

Embodiments of the present disclosure may generally relate to integrated circuits controlling points of time that an internal command is inputted to internal circuits of semiconductor devices constituting each of the integrated circuits.

2. Related Art

Recently, an integrated circuit comprised of a plurality of semiconductor devices stacked in a single package has been proposed with the development of packaging techniques. The integrated circuit comprised of the plurality of semiconductor devices may be fabricated to include electrodes and through silicon vias (TSVs). Various internal signals and a power supply voltage may be transmitted through the electrodes and through silicon vias (TSVs) of the plurality of semiconductor devices.

The plurality of semiconductor devices included in the integrated circuit may be designed to have different functions and may be encapsulated in a single package. Accordingly, it may be necessary to compensate for a skew difference between signals of the semiconductor devices encapsulated in a single package.

SUMMARY

According to an embodiment, an integrated circuit may be provided. The integrated circuit may include a first semiconductor device and a second semiconductor device. The first semiconductor device may be configured to output an internal command generated from a command to a first input through electrode. The first semiconductor device may be configured to output a high-order strobe signal generated from the internal command to a first output through electrode. The first semiconductor device may be configured to detect a phase difference between a low-order strobe signal received from a second output through electrode and the high-order strobe signal to control an input point of time of the internal command. The second semiconductor device may be configured to receive the internal command from the first input through electrode. The second semiconductor device may be configured to generate the low-order strobe signal from the internal command to output the low-order strobe signal to the second output through electrode. The second semiconductor device may be configured to detect a phase difference between the high-order strobe signal received from the first output through electrode and the low-order strobe signal to control an input point of time of the internal command.

According to an embodiment, an integrated circuit may be provided. The integrated circuit may include a first semiconductor device and a second semiconductor device. The first semiconductor device may be configured to receive an internal command from a first input through electrode. The first semiconductor device may be configured to generate a high-order strobe signal from the internal command to output the high-order strobe signal to a first output through electrode. The first semiconductor device may be configured to detect a phase difference between a low-order strobe signal received from a second output through electrode and the high-order strobe signal to control an input point of time of the internal command. The second semiconductor device may be configured to receive the internal command from the first input through electrode. The second semiconductor device may be configured to generate the low-order strobe signal from the internal command to output the low-order strobe signal to the second output through electrode. The second semiconductor device may be configured to detect a phase difference between the high-order strobe signal received from the first output through electrode and the low-order strobe signal to control an input point of time of the internal command.

According to an embodiment, an integrated circuit may be provided. The integrated circuit may include semiconductor devices stacked in a single package, each including internal circuits, coupled to one another by through electrodes, and may be configured to compensate for a timing skew difference between signals which are inputted to the internal circuits of the semiconductor devices. The semiconductor devices may be configured to compare phases of strobe signals which are generated according to internal delay times of the semiconductor devices and may be configured to control points of time that an internal command is inputted to the internal circuits of the semiconductor devices according to a comparison result of the phases of the strobe signals.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to integrated circuits controlling points of time that an internal command is inputted to internal circuits of each integrated circuit.

Figure 1:
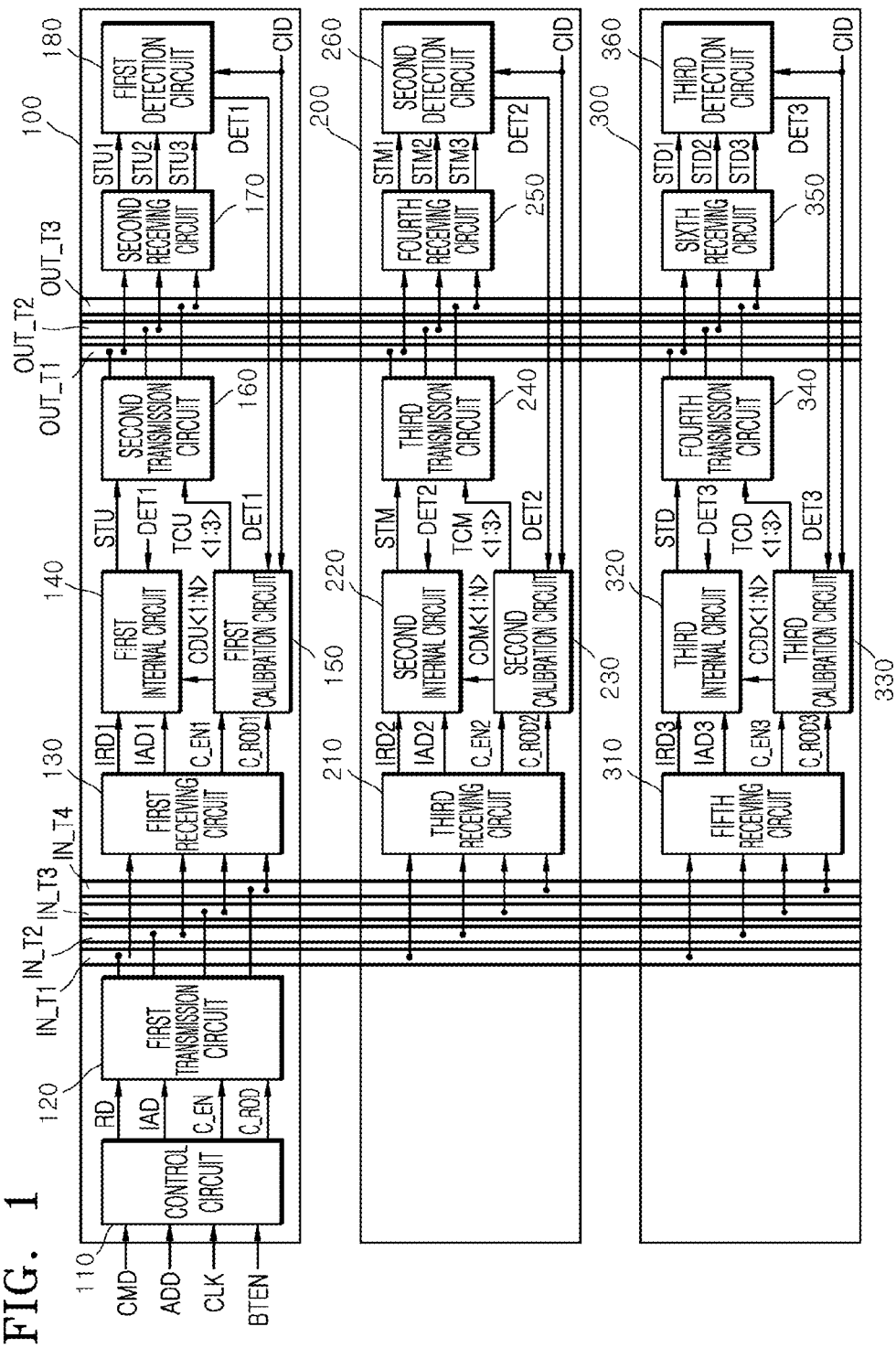
FIG. 1 is a block diagram illustrating a configuration of an integrated circuit according to an embodiment of the present disclosure.

Referring to FIG. 1, an integrated circuit according to an embodiment may include a first semiconductor device 100, a second semiconductor device 200 and a third semiconductor device 300. The first, second and third semiconductor devices 100, 200 and 300 may be physically stacked and electrically connected to each other by through silicon vias (TSVs).

The first semiconductor device 100 may include a control circuit 110, a first transmission circuit 120, a first receiving circuit 130, a first internal circuit 140, a first calibration circuit 150, a second transmission circuit 160, a second receiving circuit 170 and a first detection circuit 180.

The control circuit 110 may generate an internal command RD, an input address IAD, a calibration enablement signal C_EN and a calibration periodic signal C_ROD in response to a command CMD, an address ADD, a clock signal CLK and a boot-up signal BTEN. The control circuit 110 may decode the command CMD to generate the internal command RD during a normal operation. The control circuit 110 may decode the address ADD to generate the input address IAD during the normal operation. The control circuit 110 may generate the calibration enablement signal C_EN which is enabled after a boot-up operation. The control circuit 110 may generate the internal command RD which is enabled if the calibration enablement signal C_EN is enabled. The control circuit 110 may generate the internal command RD which is periodically created if the calibration enablement signal C_EN is enabled. The control circuit 110 may generate the calibration periodic signal C_ROD that is periodically toggled if the calibration enablement signal C_EN is enabled. The calibration enablement signal C_EN may be set as a signal which is enabled to enter a calibration operation for controlling an input point of time of the internal command RD. The boot-up operation may correspond to an operation that outputs information for controlling operations of the semiconductor devices from a fuse circuit during an initialization operation.

The first transmission circuit 120 may output the internal command RD through a first input through electrode IN_T1. The first transmission circuit 120 may output the input address IAD through a second input through electrode IN_T2. The first transmission circuit 120 may output the calibration enablement signal C_EN through a third input through electrode IN_T3. The first transmission circuit 120 may output the calibration periodic signal C_ROD through a fourth input through electrode IN_T4. The first transmission circuit 120 may be realized using a general transmitter. The first to fourth input through electrodes IN_T1, IN_T2, IN_T3 and IN_T4 may be realized using through silicon vias (TSVs).

The first receiving circuit 130 may receive the internal command RD from the first input through electrode IN_T1 to generate a first internal read signal IRD1. The first receiving circuit 130 may receive the input address IAD from the second input through electrode IN_T2 to generate a first internal address IAD1. The first receiving circuit 130 may receive the calibration enablement signal C_EN from the third input through electrode IN_T3 to generate a first internal enablement signal C_EN1. The first receiving circuit 130 may receive the calibration periodic signal C_ROD from the fourth input through electrode IN_T4 to generate a first internal periodic signal C_ROD1. The first receiving circuit 130 may be realized using a general receiver.

The first internal circuit 140 may generate a high-order strobe signal STU from the first internal read signal IRD1 in response to a first detection signal DET1. The first internal circuit 140 may delay the first internal read signal IRD1 by a delay time determined in response to a high-order code signal CDU<1:N> to generate the high-order strobe signal STU during the calibration operation. The first internal circuit 140 may receive or output data (DQ of FIG. 3) according to the first internal address IAD1 and the first internal read signal IRD1 delayed by a delay time determined in response to the high-order code signal CDU<1:N> during the normal operation.

The first calibration circuit 150 may generate the high-order code signal CDU<1:N> that is counted in response to the first internal periodic signal C_ROD1 and the first detection signal DET1. The first calibration circuit 150 may generate a high-order transmission control signal TCU<1:3> according to chip identification information CID in response to the first internal enablement signal C_EN1. The chip identification information CID may be set to have a logic level combination for enabling a first bit (i.e., a first high-order transmission control signal) TCU<1> of the high-order transmission control signal TCU<1:3> during the calibration operation. The chip identification information CID may be set to have a logic level combination for enabling any one of bits included in the high-order transmission control signal TCU<1:3> during the normal operation.

The second transmission circuit 160 may output the high-order strobe signal STU to a first output through electrode OUT_T1 in response to the first high-order transmission control signal TCU<1> during the calibration operation. The second transmission circuit 160 may be realized to output the high-order strobe signal STU to any one selected from the group consisting of the first output through electrode OUT_T1, a second output through electrode OUT_T2 and a third output through electrode OUT_T3 in response to the high-order transmission control signal TCU<1:3> during the normal operation. The second transmission circuit 160 may be realized using a general transmitter. The first to third output through electrodes OUT_T1, OUT_T2 and OUT_T3 may be realized using TSVs.

The second receiving circuit 170 may receive the high-order strobe signal STU from the first output through electrode OUT_T1 to generate a first high-order transmission strobe signal STU1. The second receiving circuit 170 may receive a mid-order strobe signal STM from the second output through electrode OUT_T2 to generate a second high-order transmission strobe signal STU2. The second receiving circuit 170 may receive a low-order strobe signal STD from the third output through electrode OUT_T3 to generate a third high-order transmission strobe signal STU3. The second receiving circuit 170 may be realized using a general receiver.

The first detection circuit 180 may compare phases of the first, second and third high-order transmission strobe signals STU1, STU2 and STU3 with each other to generate the first detection signal DET1. The first detection circuit 180 may generate the first detection signal DET1 according to the first high-order transmission strobe signal STU1 selected in response to the chip identification information CID and a phase comparison result of the first to third high-order transmission strobe signals STU1, STU2 and STU3.

The second semiconductor device 200 may include a third receiving circuit 210, a second internal circuit 220, a second calibration circuit 230, a third transmission circuit 240, a fourth receiving circuit 250 and a second detection circuit 260.

The third receiving circuit 210 may receive the internal command RD from the first input through electrode IN_T1 to generate a second internal read signal IRD2. The third receiving circuit 210 may receive the input address IAD from the second input through electrode IN_T2 to generate a second internal address IAD2. The third receiving circuit 210 may receive the calibration enablement signal C_EN from the third input through electrode IN_T3 to generate a second internal enablement signal C_EN2. The third receiving circuit 210 may receive the calibration periodic signal C_ROD from the fourth input through electrode IN_T4 to generate a second internal periodic signal C_ROD2. The third receiving circuit 210 may be realized using a general receiver.

The second internal circuit 220 may generate the mid-order strobe signal STM from the second internal read signal IRD2 in response to a second detection signal DET2. The second internal circuit 220 may delay the second internal read signal IRD2 by a delay time determined in response to a mid-order code signal CDM<1:N> to generate the mid-order strobe signal STM during the calibration operation. The second internal circuit 220 may receive or output the data (DQ of FIG. 3) according to the second internal address IAD2 and the second internal read signal IRD2 delayed by a delay time determined in response to the mid-order code signal CDM<1:N> during the normal operation. The second internal circuit 220 may be realized to have the same configuration as the first internal circuit 140 except input and output signals. Accordingly, the second internal circuit 220 may perform substantially the same operation as the first internal circuit 140.

The second calibration circuit 230 may generate the mid-order code signal CDM<1:N> that is counted in response to the second internal periodic signal C_ROD2 and the second detection signal DET2. The second calibration circuit 230 may generate a mid-order transmission control signal TCM<1:3> according to the chip identification information CID in response to the second internal enablement signal C_EN2. The chip identification information CID may be set to have a logic level combination for enabling a second bit (i.e., a second mid-order transmission control signal) TCM<2> of the mid-order transmission control signal TCM<1:3> during the calibration operation. The chip identification information CID may be set to have a logic level combination for enabling any one of bits included in the mid-order transmission control signal TCM<1:3> during the normal operation. The second calibration circuit 230 may be realized to have the same configuration as the first calibration circuit 150 except input and output signals. Accordingly, the second calibration circuit 230 may perform substantially the same operation as the first calibration circuit 150.

The third transmission circuit 240 may output the mid-order strobe signal STM to the second output through electrode OUT_T2 in response to the second mid-order transmission control signal TCM<2> during the calibration operation. The third transmission circuit 240 may be realized to output the mid-order strobe signal STM to any one selected from the group consisting of the first to third output through electrodes OUT_T1, OUT_T2 and OUT_T3 in response to the mid-order transmission control signal TCM<1:3> during the normal operation. The third transmission circuit 240 may be realized using a general transmitter.

The fourth receiving circuit 250 may receive the high-order strobe signal STU from the first output through electrode OUT_T1 to generate a first mid-order transmission strobe signal STM1. The fourth receiving circuit 250 may receive the mid-order strobe signal STM from the second output through electrode OUT_T2 to generate a second mid-order transmission strobe signal STM2. The fourth receiving circuit 250 may receive the low-order strobe signal STD from the third output through electrode OUT_T3 to generate a third mid-order transmission strobe signal STM3. The fourth receiving circuit 250 may be realized using a general receiver.

The second detection circuit 260 may compare phases of the first, second and third mid-order transmission strobe signals STM1, STM2 and STM3 with each other to generate the second detection signal DET2. The second detection circuit 260 may generate the second detection signal DET2 according to the second mid-order transmission strobe signal STM2 selected in response to the chip identification information CID and a phase comparison result of the first to third mid-order transmission strobe signals STM1, STM2 and STM3. The second detection circuit 260 may be realized to have the same configuration as the first detection circuit 180 except input and output signals. Accordingly, the second detection circuit 260 may perform substantially the same operation as the first detection circuit 180.

The third semiconductor device 300 may include a fifth receiving circuit 310, a third internal circuit 320, a third calibration circuit 330, a fourth transmission circuit 340, a sixth receiving circuit 350 and a third detection circuit 360.

The fifth receiving circuit 310 may receive the internal command RD from the first input through electrode IN_T1 to generate a third internal read signal IRD3. The fifth receiving circuit 310 may receive the input address IAD from the second input through electrode IN_T2 to generate a third internal address IAD3. The fifth receiving circuit 310 may receive the calibration enablement signal C_EN from the third input through electrode IN_T3 to generate a third internal enablement signal C_EN3. The fifth receiving circuit 310 may receive the calibration periodic signal C_ROD from the fourth input through electrode IN_T4 to generate a third internal periodic signal C_ROD3. The fifth receiving circuit 310 may be realized using a general receiver.

The third internal circuit 320 may generate the low-order strobe signal STD from the third internal read signal IRD3 in response to a third detection signal DET3. The third internal circuit 320 may delay the third internal read signal IRD3 by a delay time determined in response to a low-order code signal CDD<1:N> to generate the low-order strobe signal STD during the calibration operation. The third internal circuit 320 may receive or output the data (DQ of FIG. 3) according to the third internal address IAD3 and the third internal read signal IRD3 delayed by a delay time determined in response to the low-order code signal CDD<1:N> during the normal operation. The third internal circuit 320 may be realized to have the same configuration as the first internal circuit 140 except input and output signals. Accordingly, the third internal circuit 320 may perform substantially the same operation as the first internal circuit 140.

The third calibration circuit 330 may generate the low-order code signal CDD<1:N> that is counted in response to the third internal periodic signal C_ROD3 and the third detection signal DET3. The third calibration circuit 330 may generate a low-order transmission control signal TCD<1:3> according to the chip identification information CID in response to the third internal enablement signal C_EN3. The chip identification information CID may be set to have a logic level combination for enabling a third bit (i.e., a third low-order transmission control signal) TCD<3> of the low-order transmission control signal TCD<1:3> during the calibration operation. The chip identification information CID may be set to have a logic level combination for enabling any one of bits included in the low-order transmission control signal TCD<1:3> during the normal operation. The third calibration circuit 330 may be realized to have the same configuration as the first calibration circuit 150 except input and output signals. Accordingly, the third calibration circuit 330 may perform substantially the same operation as the first calibration circuit 150.

The fourth transmission circuit 340 may output the low-order strobe signal STD to the third output through electrode OUT_T3 in response to the third low-order transmission control signal TCD<3> during the calibration operation. The fourth transmission circuit 340 may be realized to output the low-order strobe signal STD to any one selected from the group consisting of the first to third output through electrodes OUT_T1, OUT_T2 and OUT_T3 in response to the low-order transmission control signal TCD<1:3> during the normal operation. The fourth transmission circuit 340 may be realized using a general transmitter.

The sixth receiving circuit 350 may receive the high-order strobe signal STU from the first output through electrode OUT_T1 to generate a first low-order transmission strobe signal STD1. The sixth receiving circuit 350 may receive the mid-order strobe signal STM from the second output through electrode OUT_T2 to generate a second low-order transmission strobe signal STD2. The sixth receiving circuit 350 may receive the low-order strobe signal STD from the third output through electrode OUT_T3 to generate a third low-order transmission strobe signal STD3. The sixth receiving circuit 250 may be realized using a general receiver.

The third detection circuit 360 may compare phases of the first, second and third low-order transmission strobe signals STD1, STD2 and STD3 with each other to generate the third detection signal DET3. The third detection circuit 360 may generate the third detection signal DET3 according to the third low-order transmission strobe signal STD3 selected in response to the chip identification information CID and a phase comparison result of the first to third low-order transmission strobe signals STD1, STD2 and STD3. The third detection circuit 360 may be realized to have the same configuration as the first detection circuit 180 except input and output signals. Accordingly, the third detection circuit 360 may perform substantially the same operation as the first detection circuit 180.

Figure 2:
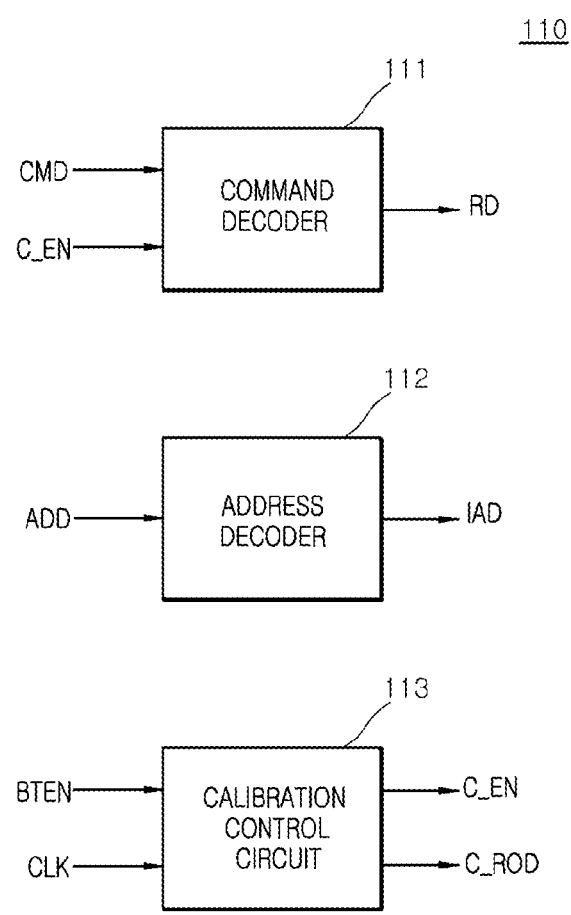
FIG. 2 is a block diagram illustrating a configuration of a control circuit included in the integrated circuit of FIG. 1.

Referring to FIG. 2, the control circuit 110 may include a command decoder 111, an address decoder 112 and a calibration control circuit 113.

The command decoder 111 may decode the command CMD to generate the internal command RD during the normal operation. The command decoder 111 may generate the internal command RD which is enabled in response to the calibration enablement signal C_EN during the calibration operation. The command decoder 111 may generate the internal command RD which is periodically created in response to the calibration enablement signal C_EN during the calibration operation. Although FIG. 2 illustrates the command CMD with a single signal, the command CMD may include a plurality of bits. The internal command RD may be set as an internal command for entering a read operation that outputs the data (DQ of FIG. 3). The internal command RD may be set as an internal command for entering a write operation that stores the data (DQ of FIG. 3) in the integrated circuit according to the embodiments.

The address decoder 112 may decode the address ADD to generate the input address IAD. Although each of the address ADD and the input address IAD is illustrated by a single signal, each of the address ADD and the input address IAD may be set to include a plurality of bits. The address ADD may include location information for selecting any one of a plurality of banks included in a memory circuit (142 of FIG. 3). The address ADD may include location information for selecting at least one of a plurality of memory cells included in the memory circuit (142 of FIG. 3).

The calibration control circuit 113 may generate the calibration enablement signal C_EN which is enabled in response to the boot-up signal BTEN and the clock signal CLK. The calibration control circuit 113 may generate the calibration enablement signal C_EN which is enabled in synchronization with the clock signal CLK if the boot-up signal BTEN is disabled after the boot-up operation. The calibration control circuit 113 may generate the calibration periodic signal C_ROD that is toggled in synchronization with the clock signal CLK if the calibration enablement signal C_EN is enabled. The clock signal CLK may be set as a clock signal which is used in general semiconductor devices. The clock signal CLK may be set as a signal that is periodically toggled.

Figure 3:
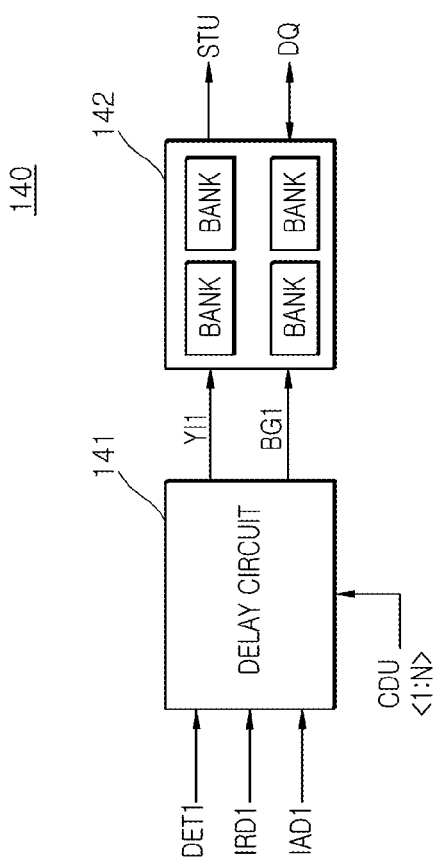
FIG. 3 is a block diagram illustrating a configuration of a first internal circuit included in the integrated circuit of FIG. 1.

Referring to FIG. 3, the first internal circuit 140 may include a delay circuit 141 and a memory circuit 142.

The delay circuit 141 may generate a first output enablement signal Y11 from the first internal read signal IRD1 in response to the first detection signal DET1. The delay circuit 141 may delay the first internal read signal IRD1 by a delay time determined according to a logic level combination of the high-order code signal CDU<1:N> to generate the first output enablement signal Y11. The delay circuit 141 may generate a first bank address BG1 from the first internal address IAD1 in response to the first detection signal DET1. The delay circuit 141 may delay the first internal address IAD1 by a delay time determined according to a logic level combination of the high-order code signal CDU<1:N> to generate the first bank address BG1. Although each of the first internal address IAD1 and the first bank address BG1 is illustrated as a single signal, each of the first internal address IAD1 and the first bank address BG1 may include a plurality of bits.

The memory circuit 142 may generate the high-order strobe signal STU which is enabled in response to the first output enablement signal Y11 during the normal operation or the calibration operation. The memory circuit 142 may select a bank in the memory circuit 142 according to the first bank address BG1 and may receive or output the data DQ through the selected bank in response to the first output enablement signal Y11, during the normal operation.

Figure 4:
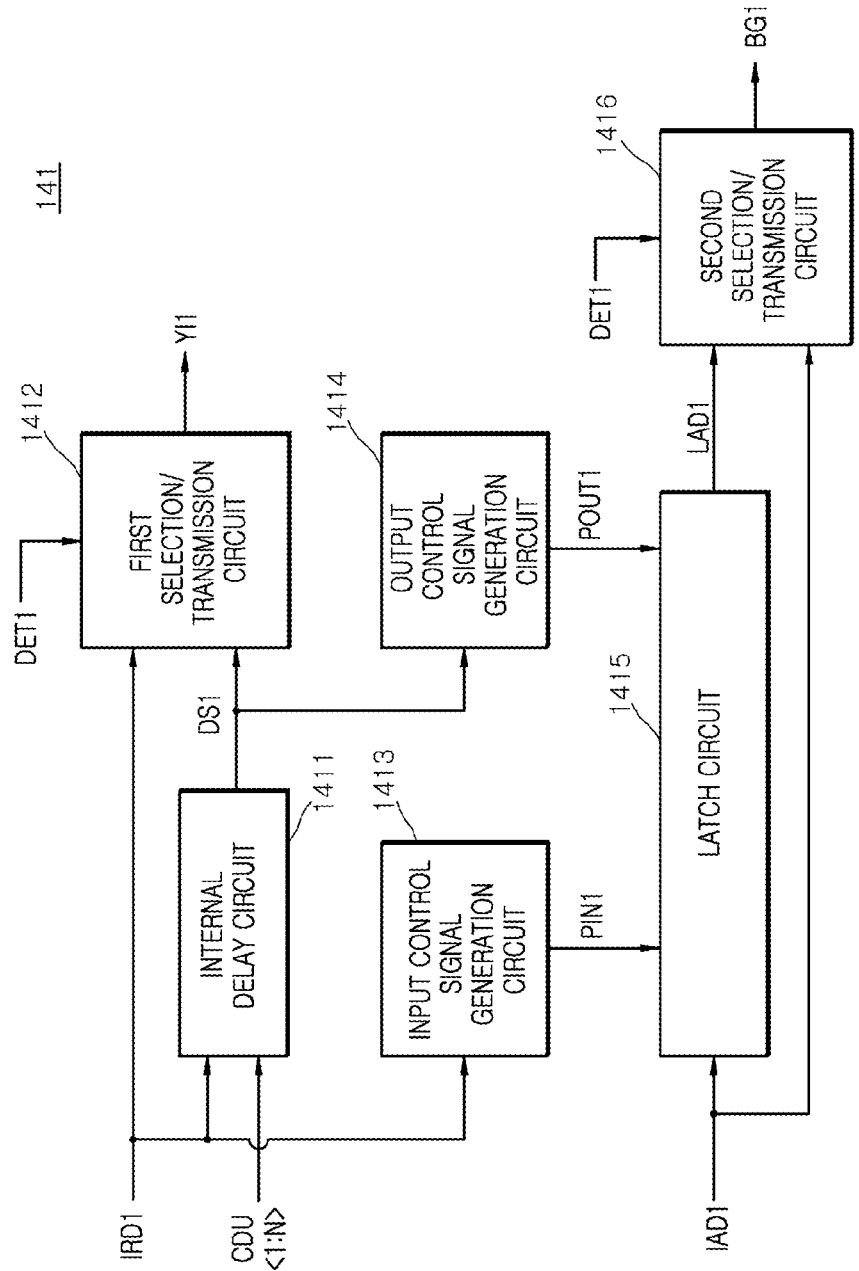
FIG. 4 is a block diagram illustrating a configuration of a delay circuit included in the first internal circuit of FIG. 3.

Referring to FIG. 4, the delay circuit 141 may include an internal delay circuit 1411, a first selection and transmission (selection/transmission) circuit 1412, an input control signal generation circuit 1413, an output control signal generation circuit 1414, a latch circuit 1415 and a second selection/transmission circuit 1416.

The internal delay circuit 1411 may delay the first internal read signal IRD1 by a delay time determined according to the high-order code signal CDU<1:N> to generate a first delay signal DS1. The delay time determined according to the high-order code signal CDU<1:N> may increase as the high-order code signal CDU<1:N> is sequentially counted.

The first selection/transmission circuit 1412 may output any one of the first internal read signal IRD1 and the first delay signal DS1 as the first output enablement signal Y11 in response to the first detection signal DET1. The first selection/transmission circuit 1412 may output the first internal read signal IRD1 as the first output enablement signal Y11 if the first detection signal DET1 is enabled to have a logic "high" level. The first selection/transmission circuit 1412 may output the first delay signal DS1 as the first output enablement signal Y11 if the first detection signal DET1 is disabled to have a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The input control signal generation circuit 1413 may generate a first input control signal PIN1 which is enabled in response to the first internal read signal IRD1. The input control signal generation circuit 1413 may generate the first input control signal PIN1 which is enabled at a point of time that the first internal read signal IRD1 is inputted to the input control signal generation circuit 1413.

The output control signal generation circuit 1414 may generate a first output control signal POUT1 which is enabled in response to the first delay signal DS1. The output control signal generation circuit 1414 may generate the first output control signal POUT1 which is enabled at a point of time that the first delay signal DS1 is inputted to the output control signal generation circuit 1414.

The latch circuit 1415 may latch the first internal address IAD1 in response to the first input control signal PIN1. The latch circuit 1415 may latch the first internal address IAD1 to output the latched first internal address IAD1 as a first latch address LAD1, in response to the first output control signal POUT1. Although FIG. 4 illustrates an example in which the latch circuit 1415 latches only one input signal, the present disclosure is not limited thereto. For example, the latch circuit 1415 may be realized to latch a plurality of first internal addresses and to output the latched first internal addresses as a plurality of first latch addresses, according to the embodiments.

The second selection/transmission circuit 1416 may output any one of the first internal address IAD1 and the first latch address LAD1 as the first bank address BG1 in response to the first detection signal DET1. The second selection/transmission circuit 1416 may output the first internal address IAD1 as the first bank address BG1 if the first detection signal DET1 is enabled to have a logic "high" level. The second selection/transmission circuit 1416 may output the first latch address LAD1 as the first bank address BG1 if the first detection signal DET1 is disabled to have a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

Figure 5:
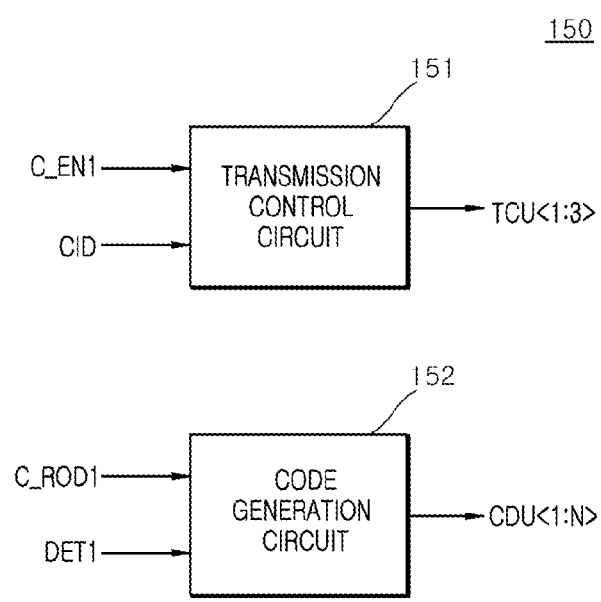
FIG. 5 is a block diagram illustrating a configuration of a first calibration circuit included in the integrated circuit of FIG. 1.

Referring to FIG. 5, the first calibration circuit 150 may include a transmission control circuit 151 and a code generation circuit 152.

The transmission control circuit 151 may generate the high-order transmission control signal TCU<1:3> in response to the first internal enablement signal C_EN1 and the chip identification information CID. The transmission control circuit 151 may enable any one of bits included in the high-order transmission control signal TCU<1:3> in response to the chip identification information CID if the first internal enablement signal C_EN1 is enabled. The transmission control circuit 151 illustrated in FIG. 5 may generate a first bit (i.e., a first high-order transmission control signal TCU<1>) of the bits included in the high-order transmission control signal TCU<1:3> which is selectively enabled according to the chip identification information CID during the calibration operation.

The code generation circuit 152 may generate the high-order code signal CDU<1:N> that is counted in response to the first internal periodic signal C_ROD1 and the first detection signal DET1. The code generation circuit 152 may generate the high-order code signal CDU<1:N> that is counted in response to the first detection signal DET1 at a falling edge of the first internal periodic signal C_ROD1. The code generation circuit 152 may count the high-order code signal CDU<1:N> if the first detection signal DET1 has a logic "low" level at a falling edge of the first internal periodic signal C_ROD1. The code generation circuit 152 may not count the high-order code signal CDU<1:N> if the first detection signal DET1 has a logic "high" level at a falling edge of the first internal periodic signal C_ROD1. Further, the logic levels of the signals may be different from or the opposite of those described. For example, a signal described as having a logic "high" level may alternatively have a logic "low" level, and a signal described as having a logic "low" level may alternatively have a logic "high" level.

Figure 6:
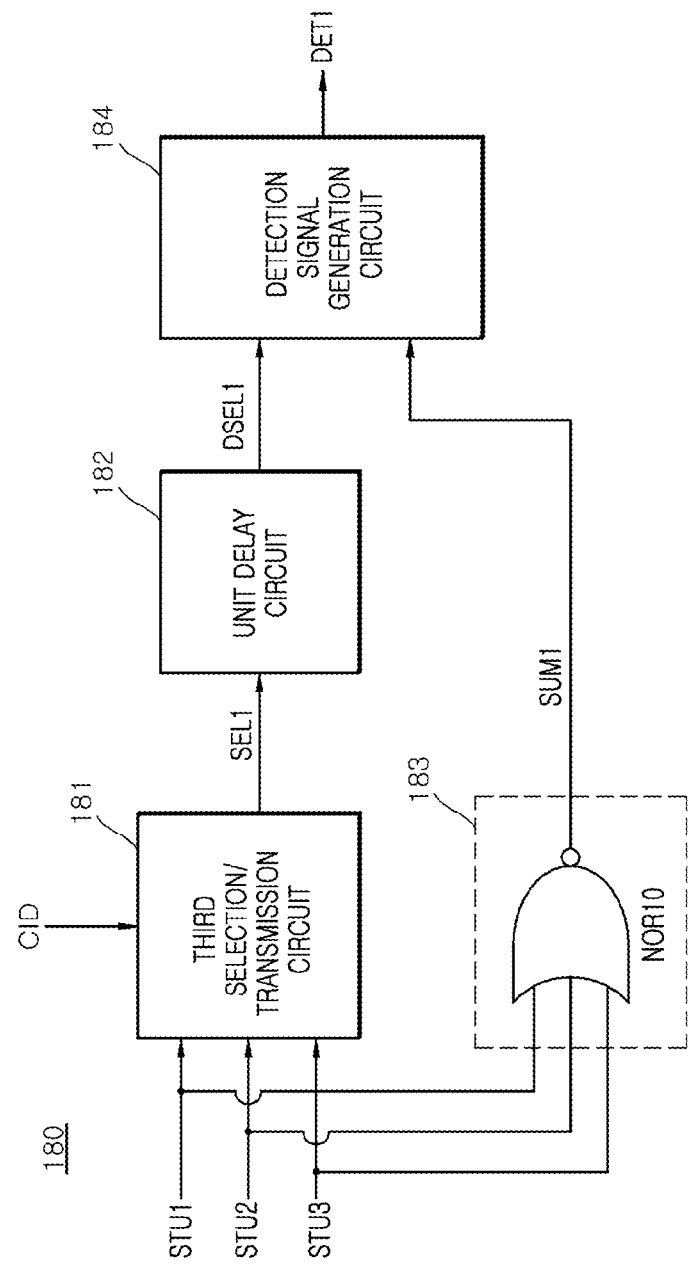
FIG. 6 is a block diagram illustrating a configuration of a first detection circuit included in the integrated circuit of FIG. 1.

Referring to FIG. 6, the first detection circuit 180 may include a third selection/transmission circuit 181, a unit delay circuit 182, a logic circuit 183 and a detection signal generation circuit 184.

The third selection/transmission circuit 181 may output any one of the first to third high-order transmission strobe signals STU1, STU2 and STU3 as a first selection signal SEL1 in response to the chip identification information CID. The third selection/transmission circuit 181 illustrated in FIG. 6 may output the first high-order transmission strobe signal STU1 as the first selection signal SEL1 according to the chip identification information CID during the calibration operation.

The unit delay circuit 182 may delay the first selection signal SEL1 to generate a first delay selection signal DSEL1. A delay time of the unit delay circuit 182 may be set to be equal to an increment of the delay time of the delay circuit 141 when the high-order code signal CDU<1:N> is counted once.

The logic circuit 183 may perform a NOR operation and may be realized using, for example but not limited to, a NOR gate NOR10. The logic circuit 183 may synthesize the first to third high-order transmission strobe signals STU1, STU2 and STU3 to generate a first synthesis signal SUM1. The logic circuit 183 may generate the first synthesis signal SUM1 having a logic "low" level if at least one of the first to third high-order transmission strobe signals STU1, STU2 and STU3 has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The detection signal generation circuit 184 may output the first delay selection signal DSEL1 as the first detection signal DET1 in response to the first synthesis signal SUM1. The detection signal generation circuit 184 may output the first delay selection signal DSEL1 as the first detection signal DET1 at a point of time that a logic level of the first synthesis signal SUM1 changes from a logic "low" level into a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

Figure 7:
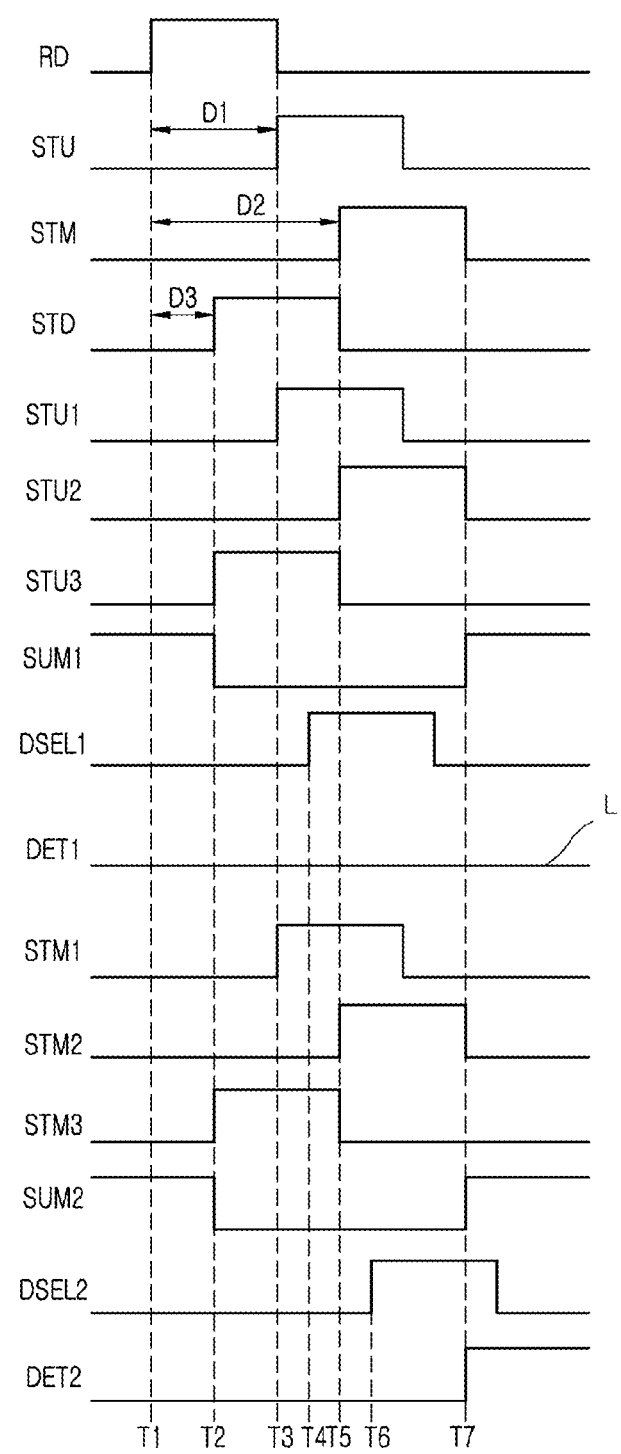
FIG. 7 is a timing diagram illustrating a calibration operation relative to operations of first and second detection circuits in an embodiment of the present disclosure.

An operation of the first and second detection circuits 180 and 260 will be described hereinafter with reference to FIG. 7 in conjunction with the calibration operation that the first and second semiconductor devices 100 and 200 control an input point of time of the internal command RD.

First, an operation for generating the high-order strobe signal STU, the mid-order strobe signal STM and the low-order strobe signal STD from the internal command RD in the first, second and third semiconductor devices 100, 200 and 300 will be described hereinafter.

At a point of time "T1", the control circuit 110 of the first semiconductor device 100 may generate the calibration enablement signal C_EN which is enabled after the boot-up operation. The control circuit 110 may generate the internal command RD which is enabled in response to the calibration enablement signal C_EN. The control circuit 110 may generate the calibration periodic signal C_ROD that is toggled in response to the calibration enablement signal C_EN.

The first transmission circuit 120 of the first semiconductor device 100 may output the internal command RD to the first input through electrode IN_T1. The first transmission circuit 120 may output the calibration enablement signal C_EN to the third input through electrode IN_T3. The first transmission circuit 120 may output the calibration periodic signal C_ROD to the fourth input through electrode IN_T4.

The first receiving circuit 130 of the first semiconductor device 100 may receive the internal command RD from the first input through electrode IN_T1 to generate the first internal read signal IRD1. The first receiving circuit 130 may receive the calibration enablement signal C_EN from the third input through electrode IN_T3 to generate the first internal enablement signal C_EN1. The first receiving circuit 130 may receive the calibration periodic signal C_ROD from the fourth input through electrode IN_T4 to generate the first internal periodic signal C_ROD1.

The first internal circuit 140 of the first semiconductor device 100 may delay the first internal read signal IRD1 by an internal delay time D1 determined in response to the high-order code signal CDU<1:N> to generate the high-order strobe signal STU. The high-order strobe signal STU may be generated at a point of time "T3" that the internal delay time D1 elapses from the point of time "T1".

The second transmission circuit 160 of the first semiconductor device 100 may output the high-order strobe signal STU to the first output through electrode OUT_T1 in response to the high-order transmission control signal TCU<1:3>.

The third transmission circuit 210 of the second semiconductor device 200 may receive the internal command RD from the first input through electrode IN_T1 to generate the second internal read signal IRD2. The third receiving circuit 210 may receive the calibration enablement signal C_EN from the third input through electrode IN_T3 to generate the second internal enablement signal C_EN2. The third receiving circuit 210 may receive the calibration periodic signal C_ROD from the fourth input through electrode IN_T4 to generate the second internal periodic signal C_ROD2.

The second internal circuit 220 of the second semiconductor device 200 may delay the second internal read signal IRD2 by an internal delay time D2 determined in response to the mid-order code signal CDM<1:N> to generate the mid-order strobe signal STM. The mid-order strobe signal STM may be generated at a point of time "T5" that the internal delay time D2 elapses from the point of time "T1".

The third transmission circuit 240 of the second semiconductor device 200 may output the mid-order strobe signal STM to the second output through electrode OUT_T2 in response to the mid-order transmission control signal TCM<1:3>.

The fifth transmission circuit 310 of the third semiconductor device 300 may receive the internal command RD from the first input through electrode IN_T1 to generate the third internal read signal IRD3. The fifth receiving circuit 310 may receive the calibration enablement signal C_EN from the third input through electrode IN_T3 to generate the third internal enablement signal C_EN3. The fifth receiving circuit 310 may receive the calibration periodic signal C_ROD from the fourth input through electrode IN_T4 to generate the third internal periodic signal C_ROD3.

The third internal circuit 320 of the third semiconductor device 300 may delay the third internal read signal IRD3 by an internal delay time D3 determined in response to the low-order code signal CDD<1:N> to generate the low-order strobe signal STD. The low-order strobe signal STD may be generated at a point of time "T2" that the internal delay time D3 elapses from the point of time "T1".

The fourth transmission circuit 340 of the third semiconductor device 300 may output the low-order strobe signal STD to the third output through electrode OUT_T3 in response to the low-order transmission control signal TCD<1:3>.

Next, an operation for controlling an input point of time of the internal command RD by comparing phases of the high-order strobe signal STU, the mid-order strobe signal STM and the low-order strobe signal STD will be described hereinafter.

At the point of time "T2", the second receiving circuit 170 of the first semiconductor device 100 may receive the low-order strobe signal STD from the third output through electrode OUT_T3 to generate the third high-order transmission strobe signal STU3 having a logic "high" level. The logic circuit 183 of the first detection circuit 180 may generate the first synthesis signal SUM1 having a logic "low" level in response to the third high-order transmission strobe signal STU3 having a logic "high" level.

At the point of time "T3", the second receiving circuit 170 of the first semiconductor device 100 may receive the high-order strobe signal STU from the first output through electrode OUT_T1 to generate the first high-order transmission strobe signal STU1 having a logic "high" level. The third selection/transmission circuit 181 of the first detection circuit 180 may output the first high-order transmission strobe signal STU1 as the first selection signal SEL1 according to the chip identification information CID.

At a point of time "T4", the unit delay circuit 182 of the first detection circuit 180 may delay the first selection signal SEL1 created at the point of time "T3" to generate the first delay selection signal DSEL1 having a logic "high" level.

At the point of time "T5", the second receiving circuit 170 of the first semiconductor device 100 may receive the mid-order strobe signal STM from the second output through electrode OUT_T2 to generate the second high-order transmission strobe signal STU2 having a logic "high" level.

At a point of time "T7", the detection signal generation circuit 184 of the first detection circuit 180 may output the first delay selection signal DSEL1 having a logic "low" level as the first detection signal DET1 in response to the first synthesis signal SUM1, a logic level of which changes from a logic "low" level into a logic "high" level.

The first calibration circuit 150 of the first semiconductor device 100 may count the high-order code signal CDU<1:N> in response to the first detection signal DET1 having a logic "low" level.

The first internal circuit 140 of the first semiconductor device 100 may delay the first internal read signal IRD1 by a delay time, which is increased according to the high-order code signal CDU<1:N> that is counted, to control a point of time that the internal command RD is inputted to the memory circuit 142.

In the above description, since the comparison result of the phases of the high-order strobe signal STU, the mid-order strobe signal STM and the low-order strobe signal STD is within the range of a predetermined time period, the first semiconductor device 100 may control an input point of time of the internal command RD. The predetermined time period may be set as a time period that the first synthesis signal SUM1 maintains a logic "low" level.

At the point of time "T2", the third receiving circuit 210 of the second semiconductor device 200 may receive the low-order strobe signal STD from the third output through electrode OUT_T3 to generate the third mid-order transmission strobe signal STM3 having a logic "high" level. A logic circuit (not illustrated) of the second detection circuit 260 may generate a second synthesis signal SUM2 having a logic "low" level in response to the third mid-order transmission strobe signal STM3 having a logic "high" level.

At the point of time "T3", the third receiving circuit 210 of the second semiconductor device 200 may receive the high-order strobe signal STU from the first output through electrode OUT_T1 to generate the first mid-order transmission strobe signal STM1 having a logic "high" level.

At the point of time "T5", the fourth receiving circuit 250 of the second semiconductor device 200 may receive the mid-order strobe signal STM from the second output through electrode OUT_T2 to generate the second mid-order transmission strobe signal STM2 having a logic "high" level. The second detection circuit 260 may output the second mid-order transmission strobe signal STM2 as a second selection signal SEL2 according to the chip identification information CID.

At a point of time "T6", the second detection circuit 260 may delay the second selection signal SEL2 created at the point of time "T5" to generate a second delay selection signal DSEL2 having a logic "high" level.

At the point of time "T7", a detection signal generation circuit (not illustrated) of the second detection circuit 260 may output the second delay selection signal DSEL2 having a logic "high" level as the second detection signal DET2 in response to the second synthesis signal SUM2, a logic level of which changes from a logic "low" level into a logic "high" level.

The second calibration circuit 230 of the second semiconductor device 200 may not count the mid-order code signal CDM<1:N> in response to the second detection signal DET2 having a logic "high" level.

A delay time of the second internal circuit 220 of the second semiconductor device 200 may not increase according to the mid-order code signal CDM<1:N> that is not counted.

In the above description, since the comparison result of the phases of the high-order strobe signal STU, the mid-order strobe signal STM and the low-order strobe signal STD is out of the range of a predetermined time period, the second semiconductor device 200 may not control an input point of time of the internal command RD. The predetermined time period may be set as a time period that the second synthesis signal SUM2 maintains a logic "low" level.

Figure 8:
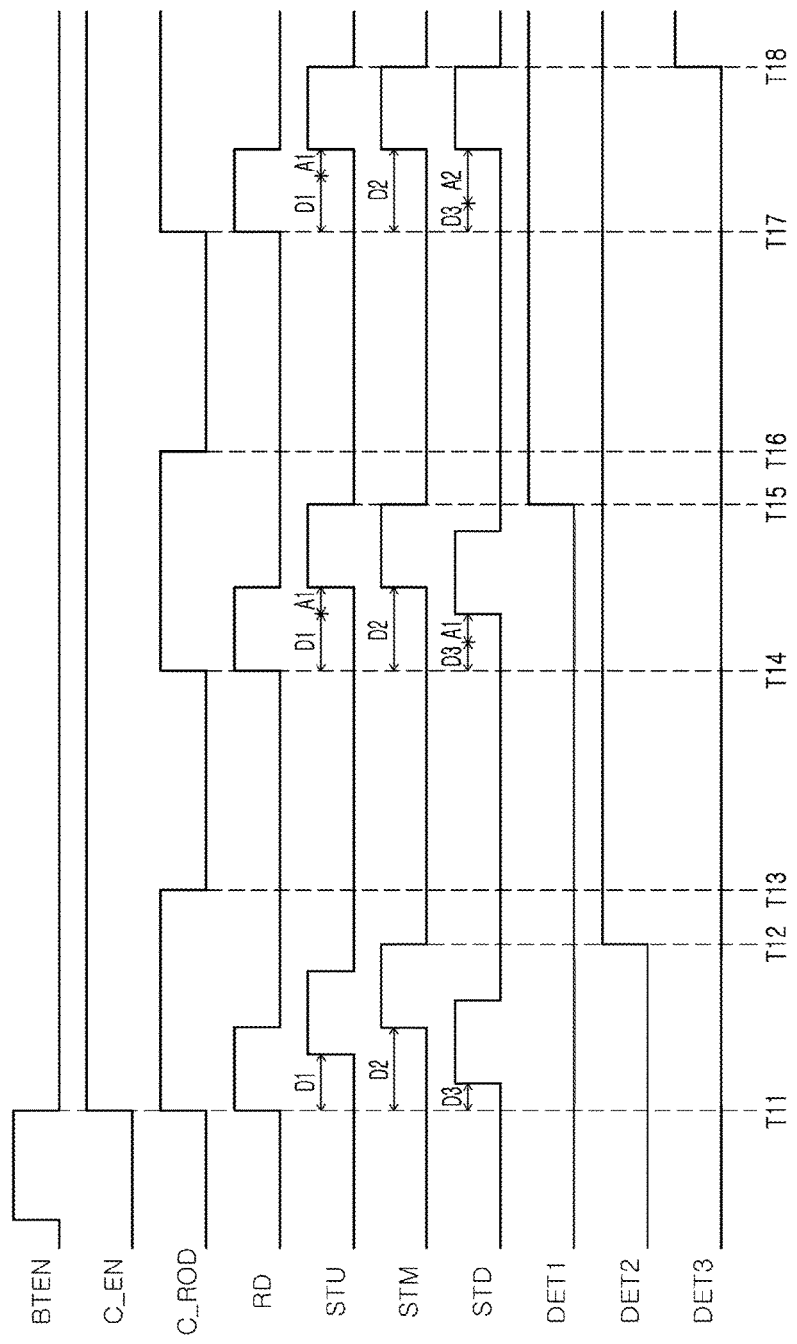
FIG. 8 is a timing diagram illustrating an operation of an integrated circuit according to an embodiment of the present disclosure.

A calibration operation of an integrated circuit according to an embodiment will be described hereinafter with reference to FIG. 8 in conjunction with a case in which an internal delay time of the second semiconductor device 200 is normal.

At a point of time "T11", the control circuit 110 of the first semiconductor device 100 may generate the calibration enablement signal C_EN which is enabled in response to the boot-up signal BTEN which is disabled to have a logic "low" level after the boot-up operation. The control circuit 110 may generate the internal command RD which is enabled in response to the calibration enablement signal C_EN. The control circuit 110 may generate the calibration periodic signal C_ROD that is toggled in response to the calibration enablement signal C_EN.

The first internal circuit 140 of the first semiconductor device 100 may generate the high-order strobe signal STU at a point of time that the internal delay time D1 elapses from the point of time "T11".

The second internal circuit 220 of the second semiconductor device 200 may generate the mid-order strobe signal STM at a point of time that the internal delay time D2 elapses from the point of time "T11".

The third internal circuit 320 of the third semiconductor device 300 may generate the low-order strobe signal STD at a point of time that an internal delay time D3 elapses from the point of time "T11".

At a point of time "T12", the first detection circuit 180 of the first semiconductor device 100 may detect phase differences between the first high-order transmission strobe signal STU1 generated from the high-order strobe signal STU, the second high-order transmission strobe signal STU2 generated from the mid-order strobe signal STM, and the third high-order transmission strobe signal STU3 generated from the low-order strobe signal STD to generate the first detection signal DET1 having a logic "low" level.

The second detection circuit 260 of the second semiconductor device 200 may detect phase differences between the first mid-order transmission strobe signal STM1 generated from the high-order strobe signal STU, the second mid-order transmission strobe signal STM2 generated from the mid-order strobe signal STM, and the third mid-order transmission strobe signal STM3 generated from the low-order strobe signal STD to generate the second detection signal DET2 having a logic "high" level.

The third detection circuit 360 of the third semiconductor device 300 may detect phase differences between the first low-order transmission strobe signal STD1 generated from the high-order strobe signal STU, the second low-order transmission strobe signal STD2 generated from the mid-order strobe signal STM, and the third low-order transmission strobe signal STD3 generated from the low-order strobe signal STD to generate the third detection signal DET3 having a logic "low" level.

The first, second and third detection signals DET1, DET2 and DET3 may be generated using the same manner as described with reference to FIG. 7. Thus, the operation of generating the first, second and third detection signals DET1, DET2 and DET3 will be omitted hereinafter to avoid duplicate explanation.

At a point of time "T13", the first calibration circuit 150 of the first semiconductor device 100 may count the high-order code signal CDU<1:N> in response to the first detection signal DET1 having a logic "low" level at a falling edge of the calibration periodic signal C_ROD.

A delay time of the first internal circuit 140 of the first semiconductor device 100 may be additionally increased by a delay time A1 according to the high-order code signal CDU<1:N> that is counted.

The second calibration circuit 230 of the second semiconductor device 200 may not count the mid-order code signal CDM<1:N> in response to the second detection signal DET2 having a logic "high" level at a falling edge of the calibration periodic signal C_ROD.

A delay time of the second internal circuit 220 of the second semiconductor device 200 may not be increased according to the mid-order code signal CDM<1:N> that is not counted.

The third calibration circuit 330 of the third semiconductor device 300 may count the low-order code signal CDD<1:N> in response to the third detection signal DET3 having a logic "low" level at a falling edge of the calibration periodic signal C_ROD.

A delay time of the third internal circuit 320 of the third semiconductor device 300 may be additionally increased by the delay time A1 according to the low-order code signal CDD<1:N> that is counted.

At a point of time "T14", the control circuit 110 of the first semiconductor device 100 may generate the internal command RD which is enabled in response to the calibration enablement signal C_EN. The control circuit 110 may generate the calibration periodic signal C_ROD that is toggled in response to the calibration enablement signal C_EN.

The first internal circuit 140 of the first semiconductor device 100 may generate the high-order strobe signal STU at a point of time that a sum of the internal delay time D1 and the delay time A1 elapses from the point of time "T14".

The second internal circuit 220 of the second semiconductor device 200 may generate the mid-order strobe signal STM at a point of time that the internal delay time D2 elapses from the point of time "T14".

The third internal circuit 320 of the third semiconductor device 300 may generate the low-order strobe signal STD at a point of time that a sum of the internal delay time D3 and the delay time A1 elapses from the point of time "T14".

At a point of time "T15", the first detection circuit 180 of the first semiconductor device 100 may detect phase differences between the first high-order transmission strobe signal STU1 generated from the high-order strobe signal STU, the second high-order transmission strobe signal STU2 generated from the mid-order strobe signal STM, and the third high-order transmission strobe signal STU3 generated from the low-order strobe signal STD to generate the first detection signal DET1 having a logic "high" level.

The second detection circuit 260 of the second semiconductor device 200 may detect phase differences between the first mid-order transmission strobe signal STM1 generated from the high-order strobe signal STU, the second mid-order transmission strobe signal STM2 generated from the mid-order strobe signal STM, and the third mid-order transmission strobe signal STM3 generated from the low-order strobe signal STD to generate the second detection signal DET2 having a logic "high" level.

The third detection circuit 360 of the third semiconductor device 300 may detect phase differences between the first low-order transmission strobe signal STD1 generated from the high-order strobe signal STU, the second low-order transmission strobe signal STD2 generated from the mid-order strobe signal STM, and the third low-order transmission strobe signal STD3 generated from the low-order strobe signal STD to generate the third detection signal DET3 having a logic "low" level.

At a point of time "T16", the first calibration circuit 150 of the first semiconductor device 100 may not count the high-order code signal CDU<1:N> in response to the first detection signal DET1 having a logic "high" level at a falling edge of the calibration periodic signal C_ROD.

A delay time of the first internal circuit 140 of the first semiconductor device 100 may not be increased according to the high-order code signal CDU<1:N> that is not counted.

The second calibration circuit 230 of the second semiconductor device 200 may not count the mid-order code signal CDM<1:N> in response to the second detection signal DET2 having a logic "high" level at a falling edge of the calibration periodic signal C_ROD.

A delay time of the second internal circuit 220 of the second semiconductor device 200 may not be increased according to the mid-order code signal CDM<1:N> that is not counted.

The third calibration circuit 330 of the third semiconductor device 300 may count the low-order code signal CDD<1:N> in response to the third detection signal DET3 having a logic "low" level at a falling edge of the calibration periodic signal C_ROD.

A delay time of the third internal circuit 320 of the third semiconductor device 300 may be additionally increased by a delay time A2 according to the low-order code signal CDD<1:N> that is counted.

At a point of time "T17", the control circuit 110 of the first semiconductor device 100 may generate the internal command RD which is enabled in response to the calibration enablement signal C_EN. The control circuit 110 may generate the calibration periodic signal C_ROD that is toggled in response to the calibration enablement signal C_EN.

The first internal circuit 140 of the first semiconductor device 100 may generate the high-order strobe signal STU at a point of time that a sum of the internal delay time D1 and the delay time A1 elapses from the point of time "T17".

The second internal circuit 220 of the second semiconductor device 200 may generate the mid-order strobe signal STM at a point of time that the internal delay time D2 elapses from the point of time "T17".

The third internal circuit 320 of the third semiconductor device 300 may generate the low-order strobe signal STD at a point of time that a sum of the internal delay time D3 and the delay time A2 elapses from the point of time "T17".

At a point of time "T18", the first detection circuit 180 of the first semiconductor device 100 may detect phase differences between the first high-order transmission strobe signal STU1 generated from the high-order strobe signal STU, the second high-order transmission strobe signal STU2 generated from the mid-order strobe signal STM, and the third high-order transmission strobe signal STU3 generated from the low-order strobe signal STD to generate the first detection signal DET1 having a logic "high" level.

The second detection circuit 260 of the second semiconductor device 200 may detect phase differences between the first mid-order transmission strobe signal STM1 generated from the high-order strobe signal STU, the second mid-order transmission strobe signal STM2 generated from the mid-order strobe signal STM, and the third mid-order transmission strobe signal STM3 generated from the low-order strobe signal STD to generate the second detection signal DET2 having a logic "high" level.

The third detection circuit 360 of the third semiconductor device 300 may detect phase differences between the first low-order transmission strobe signal STD1 generated from the high-order strobe signal STU, the second low-order transmission strobe signal STD2 generated from the mid-order strobe signal STM, and the third low-order transmission strobe signal STD3 generated from the low-order strobe signal STD to generate the third detection signal DET3 having a logic "high" level.

Subsequently, the first calibration circuit 150 of the first semiconductor device 100 may not count the high-order code signal CDU<1:N> in response to the first detection signal DET1 having a logic "high" level at a falling edge of the calibration periodic signal C_ROD.

A delay time of the first internal circuit 140 of the first semiconductor device 100 may not be increased according to the high-order code signal CDU<1:N> that is not counted.

The second calibration circuit 230 of the second semiconductor device 200 may not count the mid-order code signal CDM<1:N> in response to the second detection signal DET2 having a logic "high" level at a falling edge of the calibration periodic signal C_ROD.

A delay time of the second internal circuit 220 of the second semiconductor device 200 may not be increased according to the mid-order code signal CDM<1:N> that is not counted.

The third calibration circuit 330 of the third semiconductor device 300 may not count the low-order code signal CDD<1:N> in response to the third detection signal DET3 having a logic "high" level at a falling edge of the calibration periodic signal C_ROD.

A delay time of the third internal circuit 320 of the third semiconductor device 300 may not be increased according to the low-order code signal CDD<1:N> that is not counted.

As described above, an integrated circuit according to an embodiment may compare phases of strobe signals which are generated according to internal delay times of semiconductor devices stacked in a package and may control points of time that an internal command is inputted to internal circuits of the semiconductor devices according to the comparison result of the phases of the strobe signals. Thus, it may be possible to compensate for a timing skew difference between signals which are inputted to the internal circuits of the semiconductor devices encapsulated in a single package.

Figure 9:
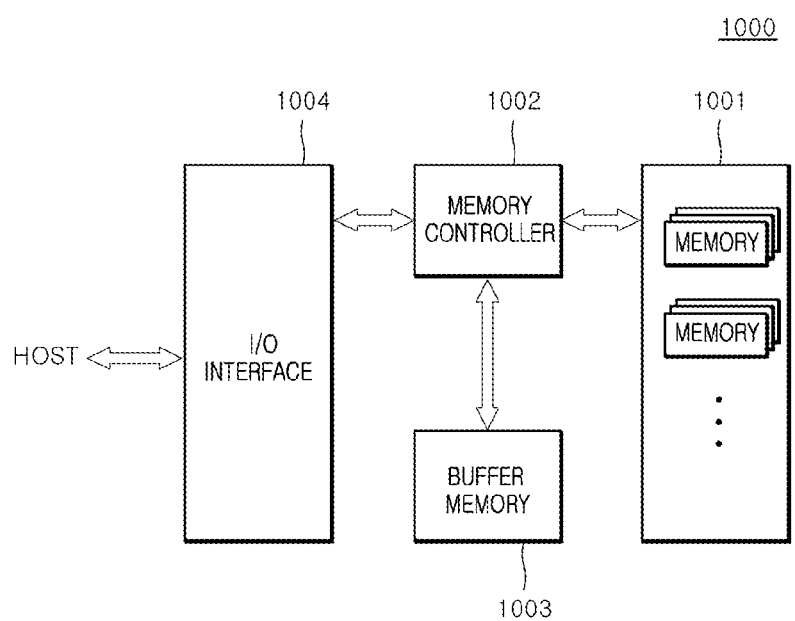
FIG. 9 is a block diagram illustrating a configuration of an electronic system employing the integrated circuit illustrated in FIGS. 1 to 8.

The integrated circuits described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the first semiconductor device 100, the second semiconductor device 200 and the third semiconductor device 300 illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. An integrated circuit comprising:
   a first semiconductor device configured to output an internal command generated from a command to a first input through electrode, configured to output a high-order strobe signal generated from the internal command to a first output through electrode, and configured to detect a phase difference between a low-order strobe signal received from a second output through electrode and the high-order strobe signal to control an input point of time of the internal command; and
   a second semiconductor device configured to receive the internal command from the first input through electrode, configured to generate the low-order strobe signal from the internal command to output the low-order strobe signal to the second output through electrode, and configured to detect a phase difference between the high-order strobe signal received from the first output through electrode and the low-order strobe signal to control an input point of time of the internal command.

2. The integrated circuit of claim 1, wherein the first semiconductor device and the second semiconductor device are configured to delay the internal command by a predetermined delay time if the phase difference between the high-order strobe signal and the low-order strobe signal is within the range of a predetermined time period.

3. The integrated circuit of claim 1, wherein the first semiconductor device includes:
   a control circuit configured to generate a calibration enablement signal which is enabled after a boot-up operation, configured to generate the internal command which is enabled if the calibration enablement signal is enabled, and configured to generate a calibration periodic signal which is toggled if the calibration enablement signal is enabled;
   a first transmission circuit configured to output the internal command to the first input through electrode, configured to output the calibration enablement signal to a second input through electrode, and configured to output the calibration periodic signal to a third input through electrode;
   a first receiving circuit configured to receive the internal command to generate a first internal read signal, configured to receive the calibration enablement signal to generate a first internal enablement signal, and configured to receive the calibration periodic signal to generate a first internal periodic signal;
   a first internal circuit configured to delay the first internal read signal by a delay time determined based on a high-order code signal to generate the high-order strobe signal;
   a first calibration circuit configured to generate the high-order code signal that is counted and a high-order transmission control signal, based on the first internal enablement signal, the first internal periodic signal and a first detection signal;
   a second transmission circuit configured to output the high-order strobe signal to the first output through electrode based on the high-order transmission control signal;
   a second receiving circuit configured to receive the high-order strobe signal to generate a first high-order transmission strobe signal and configured to receive the low-order strobe signal to generate a second high-order transmission strobe signal; and
   a first detection circuit configured to compare a phase of the first high-order transmission strobe signal with a phase of the second high-order transmission strobe signal to generate the first detection signal.

4. The integrated circuit of claim 3, wherein the control circuit includes:
   a command decoder configured to generate the internal command which is enabled based on the command and the calibration enablement signal; and
   a calibration control circuit configured to generate the calibration enablement signal which is enabled based on a boot-up signal and a clock signal and configured to generate the calibration periodic signal which is toggled based on the boot-up signal and the clock signal.

5. The integrated circuit of claim 3, wherein the control circuit includes:
   an address decoder configured to decode an address to generate an input address including location information for selecting a bank in the first internal circuit.

6. The integrated circuit of claim 3, wherein the first internal circuit includes:
   a first delay circuit configured to delay the first internal read signal by a delay time determined according to a logic level combination of the high-order code signal to generate a first output enablement signal; and
   a first memory circuit configured to generate the high-order strobe signal which is enabled based on the first output enablement signal.

7. The integrated circuit of claim 6,
   wherein the first delay circuit is configured to generate a first bank address from a first internal address based on the first detection signal and is configured to delay the first internal address by a delay time determined according to a logic level combination of the high-order code signal to generate the first bank address, and
   wherein the first memory circuit is configured to select a bank included in the first memory circuit according to the first bank address.

8. The integrated circuit of claim 6, wherein the first delay circuit includes:
   a first internal delay circuit configured to delay the first internal read signal by a delay time determined according to the high-order code signal to generate a first delay signal; and
   a first selection and transmission (selection/transmission) circuit configured to output any one of the first internal read signal and the first delay signal as the first output enablement signal based on the first detection signal.

9. The integrated circuit of claim 8, wherein the first delay circuit includes:
   an input control signal generation circuit configured to generate a first input control signal which is enabled at a point of time that the first internal read signal is inputted to the input control signal generation circuit;
   an output control signal generation circuit configured to generate a first output control signal which is enabled at a point of time that the first delay signal is inputted to the output control signal generation circuit;
   a latch circuit configured to latch a first internal address to output the latched first internal address as a first latch address, based on the first output control signal; and
   a second selection/transmission circuit configured to output any one of the first internal address and the first latch address as the first bank address based on the first detection signal.

10. The integrated circuit of claim 3, wherein the first calibration circuit includes:
    a first transmission control circuit configured to generate the high-order transmission control signal based on the first internal enablement signal and chip identification information; and
    a first code generation circuit configured to generate the high-order code signal that is counted based on the first internal periodic signal and the first detection signal.

11. The integrated circuit of claim 3, wherein the first detection circuit includes:
    a third selection/transmission circuit configured to output any one of the first and second high-order transmission strobe signals as a first selection signal based on chip identification information;

a first unit delay circuit configured to delay the first selection signal to generate a first delay selection signal;

a first logic circuit configured to synthesize the first and second high-order transmission strobe signals to generate a first synthesis signal; and a first detection signal generation circuit configured to output the first delay selection signal as the first detection signal based on the first synthesis signal.

12. The integrated circuit of claim 1, wherein the second semiconductor device includes:

a third receiving circuit configured to receive the internal command to generate a second internal read signal, configured to receive a calibration enablement signal to generate a second internal enablement signal, and configured to receive a calibration periodic signal to generate a second internal periodic signal;

a second internal circuit configured to delay the second internal read signal by a delay time determined based on a low-order code signal to generate the low-order strobe signal;

a second calibration circuit configured to generate the low-order code signal that is counted and a low-order transmission control signal, based on the second internal enablement signal, the second internal periodic signal and a second detection signal;

a third transmission circuit configured to output the low-order strobe signal to the second output through electrode based on the low-order transmission control signal;

a fourth receiving circuit configured to receive the high-order strobe signal to generate a first low-order transmission strobe signal and configured to receive the low-order strobe signal to generate a second low-order transmission strobe signal; and a second detection circuit configured to compare a phase of the first low-order transmission strobe signal with a phase of the second low-order transmission strobe signal to generate the second detection signal.

13. The integrated circuit of claim 12, wherein the second internal circuit includes:

a second delay circuit configured to delay the second internal read signal by a delay time determined according to a logic level combination of the low-order code signal to generate a second output enablement signal; and a second memory circuit configured to generate the low-order strobe signal which is enabled based on the second output enablement signal.

14. The integrated circuit of claim 13, wherein the second delay circuit includes:

a second internal delay circuit configured to delay the second internal read signal by a delay time determined according to the low-order code signal to generate a second delay signal; and a fourth selection/transmission circuit configured to output any one of the second internal read signal and the second delay signal as the second output enablement signal based on the second detection signal.

15. The integrated circuit of claim 12, wherein the second calibration circuit includes:

a second transmission control circuit configured to generate the low-order transmission control signal based on the second internal enablement signal and chip identification information; and a second code generation circuit configured to generate the low-order code signal that is counted based on the second internal periodic signal and the second detection signal.

16. The integrated circuit of claim 12, wherein the second detection circuit includes:

a fifth selection/transmission circuit configured to output any one of the first and second low-order transmission strobe signals as a second selection signal based on chip identification information;

a second unit delay circuit configured to delay the second selection signal to generate a second delay selection signal;

a second logic circuit configured to synthesize the first and second low-order transmission strobe signals to generate a second synthesis signal; and a second detection signal generation circuit configured to output the second delay selection signal as the second detection signal based on the second synthesis signal.

17. An integrated circuit comprising:

a first semiconductor device configured to receive an internal command from a first input through electrode, configured to generate a high-order strobe signal from the internal command to output the high-order strobe signal to a first output through electrode, and configured to detect a phase difference between a low-order strobe signal received from a second output through electrode and the high-order strobe signal to control an input point of time of the internal command; and a second semiconductor device configured to receive the internal command from the first input through electrode, configured to generate the low-order strobe signal from the internal command to output the low-order strobe signal to the second output through electrode, and configured to detect a phase difference between the high-order strobe signal received from the first output through electrode and the low-order strobe signal to control an input point of time of the internal command.

18. The integrated circuit of claim 17, wherein the first semiconductor device and the second semiconductor device are configured to delay the internal command by a predetermined delay time if the phase difference between the high-order strobe signal and the low-order strobe signal is within the range of a predetermined time period.

19. The integrated circuit of claim 17, wherein the first semiconductor device includes:

a first receiving circuit configured to receive the internal command to generate a first internal read signal, configured to receive a calibration enablement signal from a second input through electrode to generate a first internal enablement signal, and configured to receive a calibration periodic signal from a third input through electrode to generate a first internal periodic signal;

a first internal circuit configured to delay the first internal read signal by a delay time determined based on a high-order code signal to generate the high-order strobe signal;

a first calibration circuit configured to generate the high-order code signal that is counted and a high-order transmission control signal, based on the first internal enablement signal, the first internal periodic signal and a first detection signal;

a first transmission circuit configured to output the high-order strobe signal to the first output through electrode based on the high-order transmission control signal;

a second receiving circuit configured to receive the high-order strobe signal to generate a first high-order transmission strobe signal and configured to receive the low-order strobe signal to generate a second high-order transmission strobe signal; and
a first detection circuit configured to compare a phase of the first high-order transmission strobe signal with a phase of the second high-order transmission strobe signal to generate the first detection signal.

20. The integrated circuit of claim 19, wherein the first internal circuit includes:
a first delay circuit configured to delay the first internal read signal by a delay time determined according to a logic level combination of the high-order code signal to generate a first output enablement signal; and
a first memory circuit configured to generate the high-order strobe signal which is enabled based on the first output enablement signal.

21. The integrated circuit of claim 20,
wherein the first delay circuit is configured to generate a first bank address from a first internal address based on the first detection signal and is configured to delay the first internal address by a delay time determined according to a logic level combination of the high-order code signal to generate the first bank address, and
wherein the first memory circuit is configured to select a bank included in the first memory circuit according to the first bank address.

22. The integrated circuit of claim 20, wherein the first delay circuit includes:
a first internal delay circuit configured to delay the first internal read signal by a delay time determined according to the high-order code signal to generate a first delay signal; and
a first selection and transmission (selection/transmission) circuit configured to output any one of the first internal read signal and the first delay signal as the first output enablement signal based on the first detection signal.

23. The integrated circuit of claim 21, wherein the first delay circuit includes:
an input control signal generation circuit configured to generate a first input control signal which is enabled at a point of time that the first internal read signal is inputted to the input control signal generation circuit;
an output control signal generation circuit configured to generate a first output control signal which is enabled at a point of time that the first delay signal is inputted to the output control signal generation circuit;
a latch circuit configured to latch a first internal address to output the latched first internal address as a first latch address, based on the first output control signal; and
a second selection/transmission circuit configured to output any one of the first internal address and the first latch address as the first bank address based on the first detection signal.

24. The integrated circuit of claim 19, wherein the first calibration circuit includes:
a first transmission control circuit configured to generate the high-order transmission control signal based on the first internal enablement signal and chip identification information; and
a first code generation circuit configured to generate the high-order code signal that is counted based on the first internal periodic signal and the first detection signal.

25. The integrated circuit of claim 19, wherein the first detection circuit includes:

a third selection/transmission circuit configured to output any one of the first and second high-order transmission strobe signals as a first selection signal based on chip identification information;
a first unit delay circuit configured to delay the first selection signal to generate a first delay selection signal;
a first logic circuit configured to synthesize the first and second high-order transmission strobe signals to generate a first synthesis signal; and
a first detection signal generation circuit configured to output the first delay selection signal as the first detection signal based on the first synthesis signal.

26. The integrated circuit of claim 17, wherein the second semiconductor device includes:
a third receiving circuit configured to receive the internal command to generate a second internal read signal, configured to receive a calibration enablement signal from a second input through electrode to generate a second internal enablement signal, and configured to receive a calibration periodic signal from a third input through electrode to generate a second internal periodic signal;
a second internal circuit configured to delay the second internal read signal by a delay time determined based on a low-order code signal to generate the low-order strobe signal;
a second calibration circuit configured to generate the low-order code signal that is counted and a low-order transmission control signal, based on the second internal enablement signal, the second internal periodic signal and a second detection signal;
a second transmission circuit configured to output the low-order strobe signal to the second output through electrode based on the low-order transmission control signal;
a fourth receiving circuit configured to receive the high-order strobe signal to generate a first low-order transmission strobe signal and configured to receive the low-order strobe signal to generate a second low-order transmission strobe signal; and
a second detection circuit configured to compare a phase of the first low-order transmission strobe signal with a phase of the second low-order transmission strobe signal to generate the second detection signal.

27. The integrated circuit of claim 26, wherein the second internal circuit includes:
a second delay circuit configured to delay the second internal read signal by a delay time determined according to a logic level combination of the low-order code signal to generate a second output enablement signal; and
a second memory circuit configured to generate the low-order strobe signal which is enabled based on the second output enablement signal.

28. The integrated circuit of claim 27, wherein the second delay circuit includes:
a second internal delay circuit configured to delay the second internal read signal by a delay time determined according to the low-order code signal to generate a second delay signal; and
a fourth selection/transmission circuit configured to output any one of the second internal read signal and the second delay signal as the second output enablement signal based on the second detection signal.

29. The integrated circuit of claim 26, wherein the second calibration circuit includes:

a second transmission control circuit configured to generate the low-order transmission control signal based on the second internal enablement signal and chip identification information; and a second code generation circuit configured to generate the low-order code signal that is counted based on the second internal periodic signal and the second detection signal.

30. The integrated circuit of claim 26, wherein the second detection circuit includes:

a fifth selection/transmission circuit configured to output any one of the first and second low-order transmission strobe signals as a second selection signal based on chip identification information;

a second unit delay circuit configured to delay the second selection signal to generate a second delay selection signal;

a second logic circuit configured to synthesize the first and second low-order transmission strobe signals to generate a second synthesis signal; and a second detection signal generation circuit configured to output the second delay selection signal as the second detection signal based on the second synthesis signal.

31. An integrated circuit comprising:

semiconductor devices stacked in a single package, each including internal circuits, coupled to one another by through electrodes, and configured to compensate for a timing skew difference between signals which are inputted to the internal circuits of the semiconductor devices, wherein the semiconductor devices are configured to compare phases of strobe signals which are generated according to internal delay times of the semiconductor devices and configured to control points of time that an internal command is inputted to the internal circuits of the semiconductor devices according to a comparison result of the phases of the strobe signals.

32. The integrated circuit of claim 31, wherein a first semiconductor device of the semiconductor devices is configured to output the internal command generated from a command to a first input through electrode of the through electrodes, configured to output a high-order strobe signal generated from the internal command to a first output through electrode of the through electrodes, and configured to detect a phase difference between a low-order strobe signal received from a second output through electrode of the through electrodes and the high-order strobe signal to control an input point of time of the internal command.

33. The integrated circuit of claim 32, wherein a second semiconductor device of the semiconductor devices is configured to receive the internal command from the first input through electrode, configured to generate the low-order strobe signal from the internal command to output the low-order strobe signal to the second output through electrode, and configured to detect a phase difference between the high-order strobe signal received from the first output through electrode and the low-order strobe signal to control an input point of time of the internal command.

* * * * *